United States Patent [19]

Kovacich et al.

[11] Patent Number: 5,266,902
[45] Date of Patent: Nov. 30, 1993

[54] HIGH OR LOW VOLTAGE ELECTRICAL RESISTANCE TESTER

[76] Inventors: George Kovacich, 602 Ash St.;
George Kovacich, 803 W. Seventh St., both of Anaconda, Mont. 59711

[21] Appl. No.: 691,530

[22] Filed: Sep. 16, 1991

[51] Int. Cl.$^5$ .......................................... G01R 31/02
[52] U.S. Cl. ..................... 324/537; 324/548; 324/549; 324/556; 324/133
[58] Field of Search ............... 324/537, 545, 546, 548, 324/549, 551, 556, 133, 713

[56] References Cited

U.S. PATENT DOCUMENTS

| | | | |
|---|---|---|---|
| 3,689,832 | 9/1972 | Leto et al. | 324/133 X |
| 3,934,195 | 1/1976 | Shires | 324/548 X |
| 4,117,397 | 9/1978 | Fukao et al. | 324/537 X |
| 4,140,964 | 2/1979 | Eubank et al. | 324/557 |
| 4,434,401 | 2/1984 | York | 324/537 X |
| 4,445,084 | 4/1984 | Washington | 324/556 |
| 5,155,441 | 10/1992 | Zelm | 324/551 |

Primary Examiner—Kenneth A. Wieder
Assistant Examiner—Glenn W. Brown
Attorney, Agent, or Firm—George Kovacich

[57] ABSTRACT

An electrical resistance and insulation tester providing a 12 volt D.C. and a 500 volt D.C. testing circuit. Indicating means are comprised of an incandescent bulb for the 12 volt D.C. test circuit and a neon bulb for the 500 volt D.C. test circuit. A 12 volt D.C. power input circuit and a 110 volt A.C. power input circuit provide for operation at either input. The tester also comprises a chargeable capacitor circuit that allows for testing when the instrument is not connected to any power input source.

5 Claims, 1 Drawing Sheet

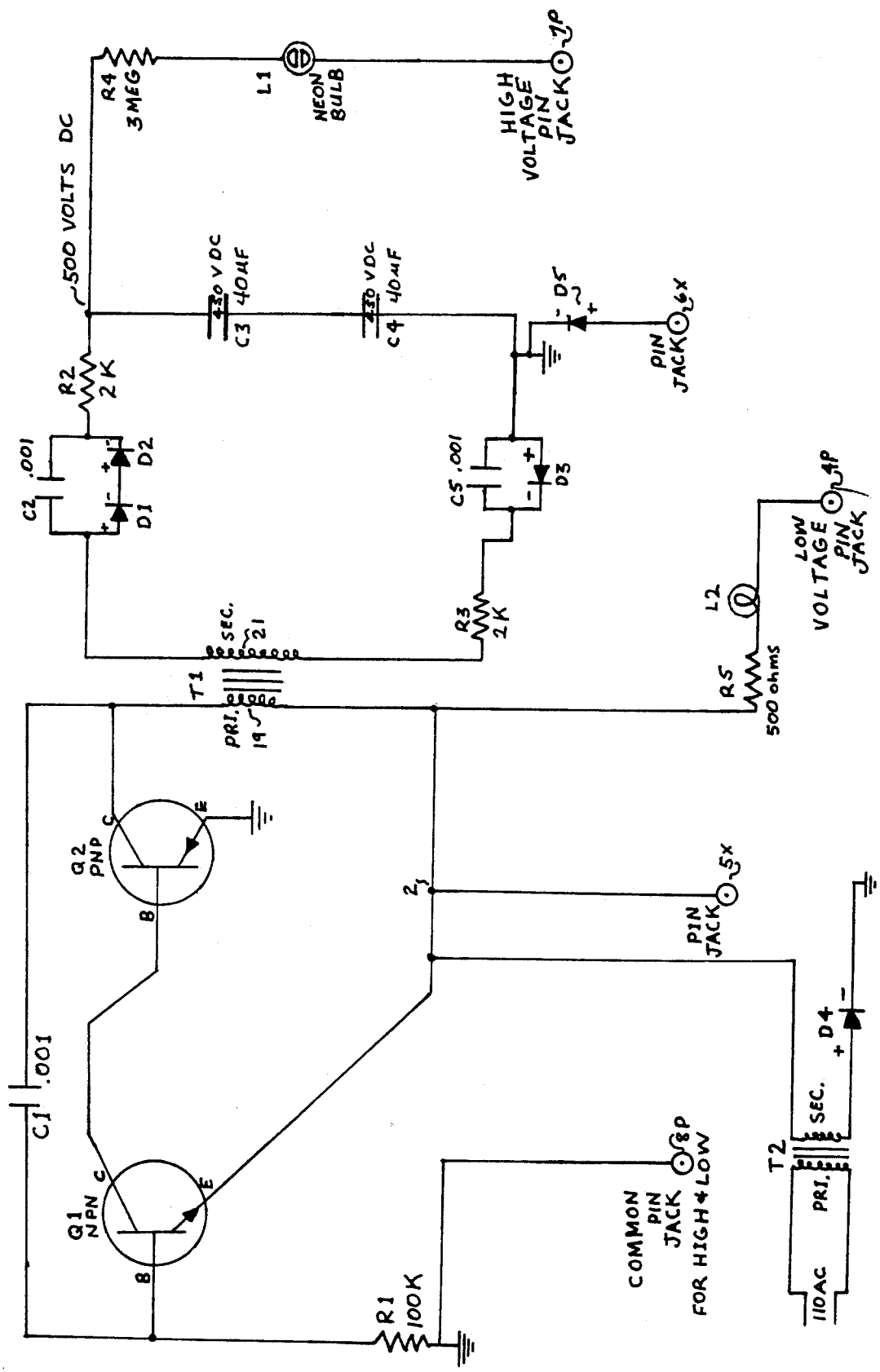

HIGH OR LOW VOLTAGE ELECTRICAL RESISTANCE TESTER

BACKGROUND OF THE INVENTION

1. Field of the Invention

This invention consists of an electrical resistance tester, specifically, a dual voltage device for the detection of electrical resistance in the range of 0 ohms to 3000 megohms. This device can be powered by either 110 volt alternating current or 12 volt direct current. The test voltages at the test probes are 12 volts direct current for the detection of relatively small resistance and 500 volts direct current for the detection of high resistance.

2. Description of prior art

Devices for the testing of electrical resistance already patented include:
U.S. Pat. No. 4,445,084 Hubert L. Washington Apr. 24, 1984
U.S. Pat. No. 4,117,397 Isao Fukao-Kimio Monma Sep. 26, 1978
U.S. Pat. No. 3,934,195 Val Henery Shires Jan. 20, 1976
U.S. Pat. No. 4,434,401 Robert A. York Feb. 28, 1984
U.S. Pat. No. 4,140,964 Carol Eubank-Carroll Hayes-Noble Wickliff Feb. 20, 1979

Of the devices already patented only the first one of the above list provides both high and low voltage test modes. It relies on the component being tested to provide the necessary voltage to operate the indicating means. If the component is in the de-energized state no reading can be taken. The others are designed primarily for high resistance detection. The HIGH OR LOW ELECTRICAL RESISTANCE TESTER overcomes these problems by supplying its own operating power and the high voltage test mode incorporated into this tester in which approximately 500 volts D.C. is applied to the component being tested through a neon light and a resistor is safe and unique.

SUMMARY OF THE INVENTION

The HIGH OR LOW ELECTRICAL RESISTANCE TESTER can be powered by two different sources, either 110 volt alternating current or 12 volt direct current. This makes it very versatile in use. In the shop where 110 volt A.C. is available it can be plugged into an outlet. In automotive work, the battery of the vehicle provides the 12 volt D.C. to operate the instrument. In field applications a battery pack will provide the 12 volts D.C. needed to operate the instrument. The low voltage test mode is used for relatively small resistances. When the component being tested has very low resistance the indicator lamp will glow full bright. As the resistance of the component being tested increases the lamp will glow less brightly. If the lamp fails to glow the component being tested is open or the resistance is beyond the range of the low voltage mode. The 12 volt D.C. utilized in the low voltage test mode, in conjunction with the incandescent lamp used as an indicating means, limits the maximum value of resistance detectable in this mode. The high voltage mode utilizes 500 volts D.C. and a neon lamp as an indicator. In the high voltage mode resistances up to 3000 megohms are detectable. The 500 volt D.C. is supplied by an oscillator circuit connected to a transformer. This high voltage circuit is limited to a maximum amperage of 0.00016 amps making it safe for the operator and providing over current protection for the component being tested.

BRIEF DESCRIPTION OF THE DRAWING

The drawing is a schematic showing the components and the connections. The components are identified by number, some with added letters, to facilitate location in the detailed description and on the component identification list.

DETAILED DESCRIPTION

This device is basically a 500 volt rechargeable capacitor which is comprised of two capacitors C3 and C4 on the drawing. These capacitors can be charged with either 110 volt alternating household current (AC) or by a 12 volt direct current (DC) battery and hold the charge until they are discharged. This rechargeable capacitor can be used to detect electrical leakage and thus weaknesses in electrical components such as low voltage diodes, transistors, wires, bulbs, etc. and high voltage capacitors, rectifiers, and leakage between motor windings, etc. The resistance of these and other types of electrical components can be tested using the tester by connecting it to the component(s) to be tested by means of one positive wire probe and one negative wire probe which are connected to the tester by means of various pin jacks. (All pin jacks are small and are used as connections for the probes. Two regular sized probes (not shown on the drawing) can be from 18" to 24" long. They consist of a piece of insulated wire that has metal connecting ends. The connecting ends fit into the pin jacks. At present, two 24" probes are used with the testing device.) Pin jacks (4P) and (8P) are used to test components using the low voltage mode of the tester. Pin jacks (7P) and (8P) are used to test components using the high voltage mode of the tester. Pin jack (8P) is the common ground for both modes. The two modes along with the pin jack connectors are described below. (The other two pin jacks (5x) and (6x) are not used for testing. They are used to connect the tester to an external 12 volt direct current energy source which is used to charge the tester. Pin jack (5x) is negative and pin jack (6x) is positive as described below. Voltage is applied across the probes through the device to be tested.

The amount of current flowing through the component that is being tested shows the absence or existence of resistance of that component. The existence or absence of resistance is indicated by a neon bulb L1 (for high voltage) or by an incandescent bulb L2 (for low voltage component) both of which are on the top of the device and are side by side for easy viewing. If the resistance of the component is low or absent, the light on the tester will glow brightly. Conversely, if the resistance of the component is high, the light will glow for only a few seconds and then will sometimes go out or will glow dimly. In actuality, a dim glow of the bulb on the tester indicates that the component has a very high resistance and may either be operable or not depending on the component you are checking.

This tester utilizes two modes to enhance its versatility. Mode one is the low voltage component, and it consists of a 12 volt D.C. continuity circuit which uses an incandescent lamp (L2) as an indicator. Mode two is the high voltage component, and it consists of a 500 volt D.C. continuity insulation circuit which uses a type 1-1 neon bulb (L1) as an indicator. Energy to charge and thus operate the tester can be supplied by either a 12 volt D.C. source or a 110 volt A.C. energy source. When the low voltage mode is being used, the tester must remain connected to the energy supply source. When operated in the high voltage mode, however, the tester is charged by an energy source and then it may be disconnected from the energy source when the tester is fully charged. Once charged, the tester can be used for testing electrical components in the high voltage mode.

One of the main components of this device is the oscillator located in the upper left corner of the diagram). An oscillator is an electronic circuit that turns itself on and off automatically once it is activated. This oscillator output is a pulsating voltage that is used to power the 500 volt D.C. test circuit. This oscillator is composed of two transistors and a capacitor. Q1 is a (NPN) EXR 180 transistor. Q2 is a (PNP) EXR 180 transistor. Both transistors Q1 and Q2 are rated at 20 amps Capacitor (C1) is a 0.001 microfarad (mfd) capacitor rated at 600 volts, and it is used in the charge-discharge circuit of the oscillator.

The NPN transistor Q1 is connected directly from its collector to the base of Q2. Capacitor C1 feeds back from the Q2 collector to the Q1 base. The Q1 base is connected to ground via a 100k resistor (R1) which is used in the charge-discharge circuit of the oscillator. The output of the oscillator goes to the primary winding of transformer former T1 from the Q2 collector. When D.C. voltage is applied to the oscillator an excess of electrons migrates to the collector of Q2 through the primary winding of T1 and the emitter Q1. It also places in excess of electrons on the capacitor C1 thus charging C1. This makes the base of Q1 positive. A forward bias results across the emitter base junction of Q1. This turns Q1 on. Q1 conducts until it saturates. This effect is felt on the base of Q2 (because Q1 collector is connected to the base of Q2) this turns Q2 on and Q1 off. Therefore, either Q1 or Q2 is conducting causing an oscillating action. This cycle continues as long as operating voltage is supplied to the oscillator.

The oscillator can be energized by an external 110 volt alternating current (A.C.) source through a plug (marked 110 A.C.) or by a 12 volt direct current (D.C.) source such as a car battery which can be connected to the device by wires through pin jacks 5x and 6x (explained below).

When powered by 110 volt A.C. household current, a two pronged plug on a cord, which is part of the tester, is plugged into an ordinary wall socket. The cord for this plug can be of various lengths and is currently about 8 feet long.

To provide power to the tester using a 12 volt D.C. source, two wires are used to connect an external 12 volt D.C. source such as a car battery through pin jacks 5x and 6x. One wire is attached to the positive point of the 12 volt D.C. source and to the tester at pin jack 6x. Pin jack 6x is connected to ground. (The tester has a positive ground system.) Rectifier D5 is connected from pin jack 6x to ground. This rectifier will only pass voltage in a positive direction which protects the oscillator from wrong polarity voltages. The second wire is connected to the negative point of the 12 volt D.C. source and to the tester at pin jack 5x. Pin jack 5x is connected to point 2. This 12 volts D.C. will power the tester so that it will operate in either high or low modes.

Low voltage Mode

The tester must be energized by either 110 volts A.C. or 12 volts D.C. in order to operate in the low voltage mode (or the high voltage mode). The low voltage test circuit components consist of pin jack 4P, r5, L2 (which is an incandescent bulb). There is a 12 volt D.C. potential produced at point 2. This 12 volt D.C. potential at point 2 is applied through R5, L2, pin jack 4P to a test probe and then to the component being tested, to pin jack 8P.

Transformer T2 is used to provide 12 volts D.C. from a 110 volt alternating current energy source to operate the low voltage mode for testing low voltage components. Also, this same 12 volt D.C. current can be used to operate the oscillator. Transformer T2 is a small iron core transformer and is wound to produce the correct voltage. Transformer T2 is a step down transformer with a ratio of 10 to 1. When transformer T2 is connected to a 110 volt A.C. source, it produces 12 volts A.C. on the secondary winding of T2. The 12 volt A.C. voltage is then rectified to D.C. by rectifier D4. In operation transformer T2 produces 12 volts D.C. at point 2. Point 2 is negative and ground is positive. The voltage produced across points 2 and ground will operate the low voltage test circuit, or this voltage will operate the high voltage test circuit through the oscillator.

External batteries or a battery charger that provide 12 volts D.C. can be used to provide power to the tester by connecting the positive lead of the 12 volt battery to pin jack 6x and the negative lead to pin jack 5x. This type of power connection to the resistance checker will operate the low voltage mode and also provide power to the oscillator within the resistance tester.

To test a component in the low voltage mode, a red wire probe is inserted into pin jack 4P and a black wire probe is inserted into pin jack 8P. The device to be tested is then connected to the resistance tester by means of these two wire probes. The red wire probe from pin jack 4P is connected to one end of the device to be tested and the black wire probe from pin jack 8P is connected to its opposite end. Components to be tested may be connected to the tester without concern for polarity. In other words, they need only be connected so that the two probes are in contact with opposite ends of the component being tested. The continuity of low voltage diodes, transistors, wires, bulbs, etc. can be tested in this way. The pilot light L2 (incandescent bulb) will glow bright when connected to elements with little or no resistance and glow more dimly or go out when there is more resistance from the component.

High Voltage Mode

As explained above in the section on the low voltage component, the oscillator is used to operate the high voltage component of the tester. Energy to the oscillator can be supplied by either 110 volt A.C. current which is reduced to 12 volts A.C. by transformer T2 and changed from A.C. to D.C. voltage by rectifier D4, or energy can be supplied to the oscillator by a 12 volt D.C. external battery or other similar 12 volt D.C. source such as a battery charger. This instrument can be charged up to 500 volts, more or less. Once it is charged, it can be disconnected from the energy source and used for testing until it is discharged to 200 volts or less. When it is discharged to 200 volts or less it must be recharged again. The tester must be supplied with energy from an outside source for at least one minute in order to be fully charged. The charge on the tester may be tested by touching the two high voltage probes together when they are connected to pin jacks 7P and 8P.

If the neon light comes on the tester is charged and it may be disconnected from the power source and used for testing. It is not necessary to disconnect the instrument from the power source before testing components.

Transformer T1 is a 1 to 50 ratio step up transformer. It is used to increase the 12 volt pulsating D.C. output of the oscillator to about 500 volts D.C. for testing high voltage components such as spark plug, capacitors, high voltage rectifiers, motor windings and other components which have up to 3000 megohms of resistance. Transformer T1 is a small iron core transformer that is wound to produce the correct voltage. The primary winding 19 of T1 has fewer turns then the secondary winding 21 with a ratio between them of 1 to 50.

When the oscillator operates, a small pulsating voltage is applied from the Q2 collector across the primary winding 19 of T1. T1 (being a step up transformer) has a high pulsating voltage across its secondary winding 21. This high pulsating voltage is rectified by rectifiers D1, D2, and D3 which are rated at one thousand volts and three amps. Capacitors C2 and C5 are rated at 0.001 mfd at 600 volts. They protect the diodes. Capacitors C3 and C4 are rated at 40 mfd at 450 volts and they serve as charge capacitors. Resistors R2 and R3 are rated at 2 watts and act as surge protectors. D1, D2, R2, C3, C4, D3, and R3 are connected in series back to the secondary winding of T1. Five hundred volts, more or less, is produced at the juncture of R2 and C3. This high voltage can be used with resistor R4 and the neon bulb L1 which are in series with the high voltage pin jack 7P. The high voltage circuit consists of a one watt, three megohm resistor R4 in series with neon bulb L1 leading pin jack 7P which is the high voltage pin jack.

To test a component using the high voltage mode, a red wire probe (positive) is connected into pin jack 7P. A black wire probe (negative) is connected into pin jack 8P. The probes from 7P and 8P are then used to connect the device to be tested to the tester for analysis. This is done by touching the probe from pin jack 7P to one end of the component to be tested and the probe from pin jack 8P to its opposite end. (It does not matter which probe is connected to a particular side of the component to be tested as long as the probes are connected on opposite sides of the component.)

For example, one type of component to be tested would be a spark plug. A spark plug can be tested while it is still in the engine. With the engine not running, the detector is connected by means of the two probes to the spark plug. One probe to the center electrode and the other probe to the base of the plug. If the neon bulb indicating light L1 on the detector glows, the spark plug is fouled and should be replaced.

The 3 megohm resistor R4 limits the maximum current flow through the probes to 0.00016 amps which makes the tester safe to use in any circumstances. Because of the low current employed here, a neon bulb is used as an indicator. The tester will check small capacitors from 0.001 to 0.1 mfd. When you check a capacitor and the light comes on just for an instant and then goes out the capacitor is good. If the light comes on strong or dim and stays that way, the capacitor is shorted and should be replaced. Since the capacitor that has been tested has drawn a charge it should be discharged for safety.

We claim:

1. An electrical test instrument for detecting the resistance of electrical components in a high voltage test mode or a low voltage test mode, whereby the test instrument produces only low currents to provide safe handling, wherein the test instrument comprises:
   (a) an oscillating circuit;
   (b) a step-up transformer, wherein a first output of said oscillating circuit is connected to a first terminal of the primary winding of said step-up transformer, and a second output of said oscillating circuit is connected to a second terminal of the primary winding of said step-up transformer;
   (c) a charge storing circuit, wherein a first terminal of the secondary winding of said step-up transformer is connected to a first input of said charge storing circuit, and a second terminal of the secondary winding of said step-up transformer is connected to a second input of said charge storing circuit;
   (d) a voltage supply for supplying 12 volts DC to said second terminal of the primary winding of said step-up transformer, wherein said voltage supply receives voltage from one of a high voltage source and a low voltage source;
   (e) said high voltage source comprising inputs for receiving 110 volts AC, a step-down transformer for decreasing the voltage to 12 volts, and a rectifier for converting the AC voltage to DC;
   (f) said low voltage source comprising inputs for receiving 12 volts DC;
   (g) a common probe, connected to an input to said oscillating circuit, for contacting a first terminal of an electrical component to be tested during a low voltage test mode and a high voltage test mode;
   (h) a low voltage probe, connected to said second output of said oscillating circuit, for contacting a second terminal of said electrical component during said low voltage test mode;
   (i) a high voltage probe, connected to an output of said charge storing circuit, for contacting the second terminal of said electrical component during said high voltage test mode;
   (j) a first indicator, connected between said low voltage probe and said second output of said oscillating circuit, for visually indicating the condition of said electrical component during said low voltage test mode; and
   (k) a second indicator, connected between said high voltage probe and said output of said charge storing circuit, for visually indicating the condition of said electrical component during said high voltage test mode.

2. The electrical test instrument of claim 1, wherein said oscillating circuit comprises two transistors and a capacitor.

3. The electrical test instrument of claim 1, wherein said charge storing circuit comprises two series-connected charge storage capacitors.

4. The electrical test instrument of claim 3, wherein said charge storage capacitors are charged to approximately 500 volts and provide voltage to said high voltage probe.

5. The electrical test instrument of claim 1, wherein the test instrument is capable of detecting a resistance within the range of 0 ohms and 3000 megohms.

* * * * *